United States Patent
Tan et al.

[11] Patent Number: 5,413,490
[45] Date of Patent: May 9, 1995

[54] IC CARD WITH GENERALLY EFFICIENT CIRCUMFERENTIAL SHIELDING

[75] Inventors: Haw-Chan Tan; Frank C. Ma, both of Diamond Bar; Vincent S. Chen, Walnut, all of Calif.

[73] Assignee: Genrife Company Limited, Hong Kong

[21] Appl. No.: 142,769

[22] Filed: Oct. 26, 1993

[51] Int. Cl.[6] .................................... H01R 9/09
[52] U.S. Cl. .................................... 439/76
[58] Field of Search .............. 439/76, 68, 328, 98, 439/607, 676, 535, 536; 235/492, 487, 488

[56] References Cited

U.S. PATENT DOCUMENTS

| | | | |
|---|---|---|---|
| 4,798,946 | 1/1989 | Fujii et al. | 235/492 |
| 4,890,197 | 12/1989 | Banjo et al. | 235/492 |
| 4,924,076 | 5/1990 | Kitamura | 235/492 |
| 5,038,250 | 8/1991 | Uenaka et al. | 235/492 |
| 5,061,845 | 10/1991 | Pinnavaia | 235/492 |
| 5,242,310 | 9/1993 | Leung | 439/76 |
| 5,244,397 | 9/1993 | Anhalt | 439/101 |
| 5,313,364 | 5/1994 | Omori et al. | 439/74 |

*Primary Examiner*—P. Austin Bradley
*Assistant Examiner*—Chuck Y. Mah

[57] ABSTRACT

An I/O card assembly (1) is provided having an insulative frame means (10, 40) sandwiched by a pair of generally similar conductive covers (50, 70). Each cover (50) includes a main plate (52) and two elongated side shielding walls (56) downward extending from two opposite sides of the plate (52) a first distance which is generally half of a height of the side wall (12) of the frame (10). A groove (18) horizontally extends along the center line of side wall (12) of the frame (10) for receiving both the hook sections (58) which are respectively inwardly formed at the outermost edges of the side shielding walls (56) of the top and the bottom covers (50, 70). Between the top and the bottom covers (50, 70), an internal PC board (80) is seated on the frame whereby two connectors (90, 100) are respectively soldered on two opposite end regions of the PC board (80) and respectively retained at two opposite ends of the main frame (10) and therefore, the PC board (80) and the two associated connectors (90, 100) are appropriately held in position in the card assembly (1) for mating with the corresponding electrical devices.

13 Claims, 2 Drawing Sheets

IC CARD WITH GENERALLY EFFICIENT CIRCUMFERENTIAL SHIELDING

BACKGROUND OF THE INVENTION

1. Field of The Invention

The invention relates to I/O card components, especially to the I/O card assembly having the maximum shielding and ESD protection thereof.

2. The Prior Art

IC cards or memory cards are used popularly in the recent years and it is also noted that I/O cards also become common in the communication system. U.S. Pat. Nos. 5,038,250, 5,061,845, 5,207,586 and 5,242,310 disclose some IC or I/O cards and their own different structures. It is also well known that electronic signals within electronic packages emit electro-magnetic energy from the package, which causes electro-magnetic interference (EMI) in other electric signals. It is desired to provide a complete and efficient shielding against the emission of EMI. On the other hand, electrostatic discharge (ESD) is also another important issue because electronic components are also very sensitive to ESD and special care must be taken in handling. It can be possible for a person to inadvertently build up a static voltage in excess of 20,000 volts DC in the course of normal activities, particularly in a dry situation.

In the structure of IC or I/O cards of the aforementioned patents, the metal top cover and bottom cover do not completely and efficiently cover the whole outer profile of the insulative frame, especially the side portions thereof. Therefore, such covers can not achieve effects of complete shielding for EMI protection and of reliable structure for ESD protection on the side portions of the card assembly where the user holds in order to load the card into the computer.

SUMMARY OF THE INVENTION

Accordingly to the present invention, an I/O card assembly is provided having an insulative frame sandwiched by a pair of generally similar conductive covers. Each cover includes a main plate and two elongated side shielding walls downward extending from two opposite sides of the plate a distance which is generally half of a height of the side wall of the frame. An groove horizontally extends along the center line of side wall of the frame for receiving both the hook portions which are respectively inwardly formed at the outermost edges of the side shielding walls of the top and the bottom covers. Between the top and the bottom covers, a internal PC board is seated on the frame whereby two connectors are respectively soldered on two opposite end regions of the PC board and respectively retained at two opposite ends of the frame and therefore, the PC board and the two associated connectors are appropriately held in position in the card assembly for mating with the corresponding electrical device.

DESCRIPTION OF THE PREFERRED EMBODIMENT

Figure 1:
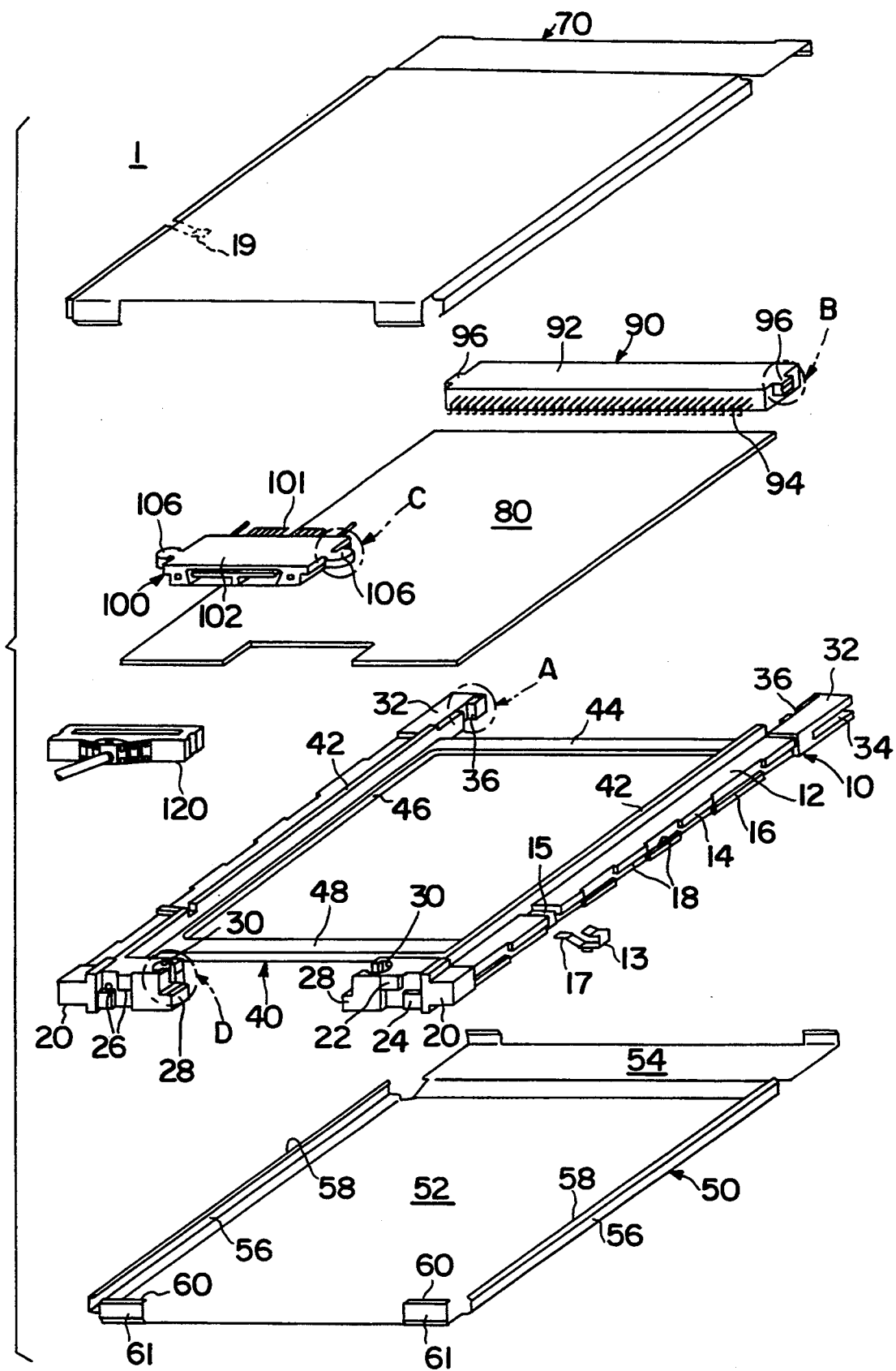
FIG. 1 is an exploded perspective view of an I/O card assembly of an presently preferred embodiment according to the present invention.

In FIG. 1, the subject I/O card assembly 1 includes a main frame 10 having a pair of side walls 12 extending in a front-to-end direction. Formed along the side surface of the whole side wall 12, an upper and a lower rows of the protrusions 14, 16 are staggered with one another whereby an elongated space 18, i.e., the gap whose vertical position is below the upper row protrusions 14 but above the lower row protrusions 16, continuously horizontally extends along generally the center line of each side wall 12.

Spaced from each other, a pair of I/O blocks 20 being portions of the main frame 10, respectively laterally integrally extend at the front ends of the side walls 12. Similar to the upper and bottom rows of the protrusions 14, 16, an upper protrusions 22 and a lower protrusions 24 are staggered with each other on the front surface of each block 20, and a space 26 extends horizontally along generally the center line thereof. Two steps 28 face to each other on the inner portions of the blocks 20, and a pair of recesses 30 are formed thereabout, respectively.

A pair of socket supports 32, being portions of the main frame 10, respectively and rearward extends integrally from the rear ends of the side walls 12. Two slots 34 are positioned along the side surface of the socket support for engagement with the guiding bars in a complementary memory card connector (not shown) for alignment therebetween when I/O card is inserted into the memory card connector. Another pair of recesses 36 are formed along the inner surfaces of the socket supports 32, respectively, and spaced from but face to each other.

An generally rectangle auxiliary frame 40 is disposed in the main frame 10, including a pair of raised bars 42 respectively integrally extending along the inner surface of the side walls 12, and terminating at the I/O blocks 20 and the socket support 32 at the front end and the rear end, respectively. A base 44 is integrally formed between the opposite raised bars 42 in the left-to-right direction, and between the opposite I/O blocks 20 and socket supports 32 in the front-to-end direction. The base is composed of two opposite side bars 46 integrally extending inwardly from the raised bars 42, and two opposite reenforcement bars 48 extending between two opposite side bars 46 approximate the front and the rear portions thereof, respectively.

Positioned below the frame means which includes the main frame 0 and the auxiliary frame 40, is a bottom cover 50 including a main plate 52 and a rear section 54 respectively generally positioned under the main frame 40 and the socket supports 32. A pair of elongated shielding walls 56 upward extend along two opposite side edges of the main plate 52 in the front-to-end direction. The height of the shielding wall is generally one half of that of the side wall 12 of the main frame 10. Positioned at the top end of each shielding wall 56 is the hook section 58 extending inwardly so that when the bottom cover 50 is attached to the main frame 10, the shielding wall 56 generally covers one half of the side wall 12 and the hook section 58 is adapted to be retainably received within the corresponding space 18 of the side wall 12 of the main frame 10, thus fastening to the main frame 10. Two pairs of hook sections 60 and the corresponding integral shielding walls 61 are similarly respectively positioned at the front end and the rear end of the bottom cover 50 to latchably engage the spaces 26 of the blocks 20 and those (not shown) of the socket supports 32. Therefore, the bottom cover 50 generally covers the lower half portion of the associated main frame 10, the blocks 20 and the socket supports 32.

Similarly but oppositely, a top cover 70 also including the main plate and the rear section having the shielding walls and the hook sections extending therefrom to engage the centerline spaces 18, 26, etc. of the side walls 12, the blocks 20 and the socket supports 32, can cover the top half of the associated main frame 10, the blocks 20 and the socket supports 32. Therefore, the top cover 70 incorporating the bottom cover 50, generally cover the most portions of the whole assembly of the I/O card including the side walls 12 thereof except portions of the front end and the rear end of the I/O card assembly.

A PC board 80 is dimensioned and positioned on the base 44 and between the raised bars 42 of the auxiliary frame 40. The board 80 generally thereon has a number of electrical devices (not shown) and a plurality of conductive leads terminating at the pads (not shown) on the ends of the board 80.

A standard 68 pins socket 90 is positioned at the rear end of the I/O card assembly and between two socket supports 32. The socket 90 includes an elongated insulative housing 92 and two rows of contacts 94 extending therethrough in the front-to-end direction. The tails of contacts 94 is conductively mounted on the corresponding pads (not shown) positioned at the rear end of the PC board 80. A pair of mounting ears 96 are disposed on two sides of the housing 92 for respective engagement within the corresponding recesses 30 in the blocks 20. The socket 90 is adapted to mate with a complementary memory card connector (not shown) which is generally mounted on a main PC board in the computer.

Figure 1A:
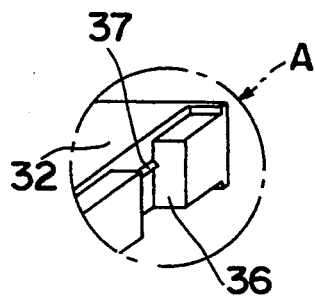
FIG. 1(A) is an enlarged view of portion A in FIG. 1.
Figure 1B:
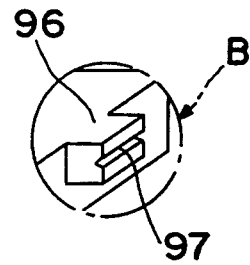
FIG. 1(B) is an enlarged view of portion B in FIG. 1.

FIG. 1(A) shows a protrusion 37 formed in each recess 36 and FIG. 1(B) shows a horizontal slot 97 positioned in each mounting ear 96, so that the mounting ears 96 of the socket 90 can be retained within the recesses 36 by the engagement of the protrusions 37 of the socket supports 32 with the horizontal slots 97 in the mounting ears 96, respectively. Therefore, the socket 90 is in position without horizontal or vertical movement.

Figure 1C:
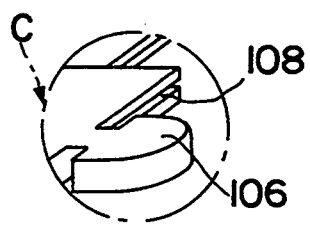
FIG. 1(C) is an enlarged view of portion C in FIG. 1.
Figure 1D:
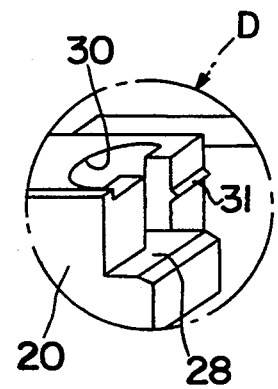
FIG. 1(D) is an enlarged view of portion D in FIG. 1.

An I/O connector 100 is positioned at the front end of the I/O card assembly. The I/O connector 100 includes an elongated insulative housing 102 having a front mating end for coupling with a cable connector 120. Similar to the socket 90, contacts 101 of the row are positioned in the front-to-end direction in the housing 102 wherein tails of contacts 101 are adapted to be conductively soldered on the corresponding pads (not shown) positioned on the front end of the PC board 80. A pair of mounting ears 106 are positioned at two ends of the insulative housing 102 for engagement with the corresponding recesses 30 of the blocks 20, respectively. A pair of horizontal grooves 108 FIG. 1(C) are also positioned at two ends of the insulative housing 102 to receive a pair of corresponding protrusions 31 FIG. 1(D) positioned on the side surfaces of the blocks 20, respectively. Accordingly, the I/O connector 100 can be retained within the space between two blocks 20 by the engagement of the mounting ears 106 with the corresponding recesses 30 without horizontal movement, and by the engagement of the grooves 108 with the corresponding protrusions 31 of the blocks 31 without vertical movement. Therefore, the I/O connector is adapted to couple to the aforementioned complementary cable connector 120 which is connected to a peripheral.

The assembling steps are as follows. First, through a tool to deflect the hook sections 58, 60 of the bottom cover 50 outwardly, the main frame 10 and the associated integral auxiliary frame 40 are latchably loaded onto the bottom cover 50 from the top, and fastened thereto by removing such tool therefrom to have the hook sections 58, 60 received within the spaces 18 and 26 by its resilience, so that the bottom cover 50 and the main frame 10 and its associated auxiliary frame 40 are assembled as a first assembly. The lower half portion of the main frame 10 is enclosed by the bottom cover 50.

Secondly, the socket 90 and the I/O connector 100 are mounted onto the PC board 80 by soldering connection of the tails of the contacts 94, 101 to the rear and front ends of the PC board 80, respectively. Accordingly, the socket 90, the I/O connector 100 and the board 80 are assembled as a second assembly.

Thirdly, the second assembly is loaded into the first assembly 200 from the top, so that as aforementioned, the socket 90 and the I/O connector 100 are adapted to be retained in position by the corresponding socket supports 32 and blocks 20. In this situation, the PC board 80 can be properly stably seated on the base 44 of the auxiliary frame 40. Therefore, the second assembly can join with the first assembly to form a third assembly.

Figure 2:
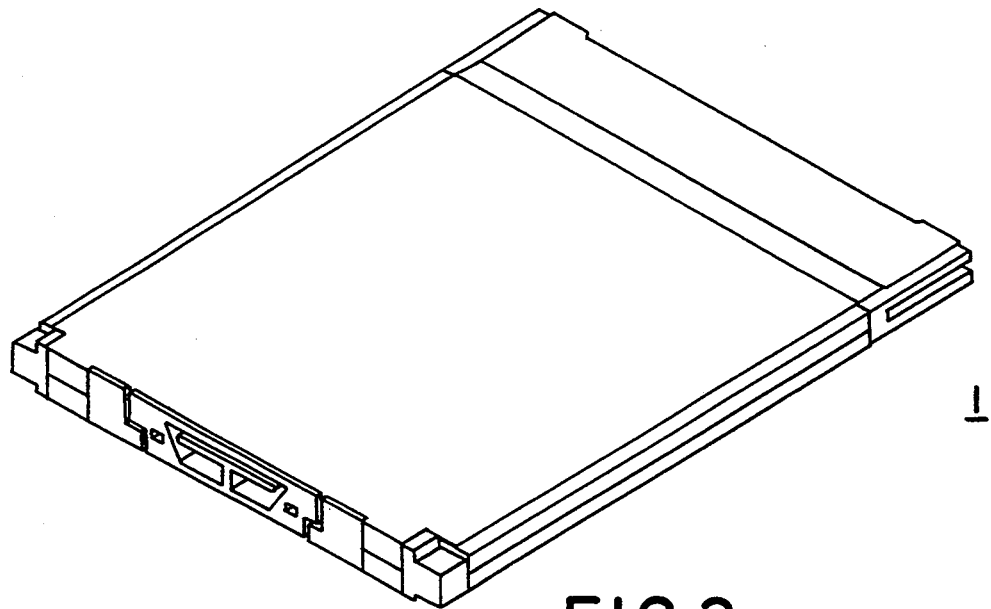
FIG. 2 is a perspective view of an assembled I/O card assembly of FIG. 1.

Lastly, similar to the bottom cover 50, through a tool, the top cover 70 can be latchably attached onto the third assembly wherein the hook sections of the top cover 70 are engaged within the corresponding spaces 18, 26 in the main frame 10. Thus, the top cover 50 encloses the upper half portion of the first assembly having the second assembly 300 therein, as shown in FIG. 2.

In comparison with the prior art I/O cards, the final I/O card assembly of the present invention obviously has a maximum shielding area including almost the complete top and bottom surfaces, left and right side surfaces, and some portions of the front and rear side surfaces thereof. Also, different from other prior art designs, the socket 90 and the I/O connector 100 of I/O card assembly in the present invention provide the retention structure, i.e., the slots 97 and the grooves 108, to retainably engage the corresponding protrusions 37 in the socket supports 32 and the protrusions 31 in the blocks 20. In other words, the socket 90 and the I/O connector 100 can initiatively latchably engage within the corresponding socket supports 32 and blocks 20 of the main frame 10 without the possibility of vertical movement. Comparatively, the PC board 80 in the present invention is not required to be directly fastened to the auxiliary frame 40 by adhesion or screws.

Differently, most prior art designs use adhesion or other fastening means to directly secure the inner PC board onto the frame; otherwise, the socket and the I/O connector are intentionally tightly sandwiched by the top cover and the bottom cover in order to have the inner assembly of the PC board and its two associated socket and I/O connector in position. It is believed that either of the prior arts methods makes it complicate or require the higher precision in manufacturing in comparison with the present invention. In other words, the present invention is easy to be manufactured and assembled.

It is also noted that the shielding walls 60 at the front and the rear end of the bottom cover 50 and the top cover 70 not only provide the more shielding area to the whole assembly, but also efficiently retainably enclose the main frame 10 therein to prohibit any relative movement between the covers 50, 70 and the main frame 10 in the front-to-end direction, and to prevent the top/bottom cover 70, 50 from lifting by an external sharp piece inadvertently inserted into the gap between the top or bottom cover 70, 50 and the socket 90 or the I/O connector 100.

For consideration of grounding, in the present invention, a separate grounding clip 13 can be optionally attached to and received in a cavity 15 in the right side wall 12 whereby a tang 17 of the clip 13 extends over the under side of the raised bars 42 and contacts the bottom surface of the PC board 80 for grounding. Oppositely, another tang 19 can be directly integrally stamped out of the top cover 70 and extends inwardly downward to contact the top surface of the PC board 80 for grounding. Alternatively, such tang 19 can also be of a separate piece as the grounding clip 13 received in a corresponding cavity. In the latter situation, the top cover 70 and bottom cover 50 have the same configuration so that only one mold or procedure is required to manufacture both the top cover 70 and the bottom cover 50 for saving cost. Even though in the former situation, the top cover 70 can be made by an additional stamping procedure from the bottom cover 50. Using a common mold or procedure for two components (i.e., top cover 70 and the bottom cover 50) in the present is efficient in manufacturing.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. An I/O card assembly comprising:
    a main frame having two side walls, an elongated space extending horizontally along generally a centerline of each side wall in a front-to-end direction;
    an auxiliary frame integrally formed in the main frame;
    a pair of blocks positioned at front ends of the side walls, respectively;
    a pair of socket supports positioned at rear ends of the side walls, respectively;
    a PC board seated on said auxiliary frame;
    a socket positioned between said pair of socket supports, said socket having contact tails conductively mounted at a rear end of the PC board;
    an I/O connector positioned between said pair of blocks, said I/O connector having contacts tails conductively mounted at a front end of the PC board; and
    a top cover and a bottom cover being attached to the main frame from the top and from the bottom, respectively, each cover having a main plate and a pair of shielding walls vertically extending, along opposite side edges of the main plane in the front-to-end direction, a distance which is generally one half of a height of the side wall of the main frame wherein said shielding walls of the top cover extend downwardly and said shielding walls of the bottom cover extend upwardly.

2. The I/O card assembly as described in claim 1, wherein each shielding wall of the covers further comprises a hook section extending inward for reception within the space in the corresponding side wall of the main frame.

3. The I/O card assembly as described in claim 2, wherein each cover further comprises shielding walls and associated hook sections at both front and rear ends thereof for engagement with spaces in the blocks and in the socket supports, respectively.

4. The I/O card assembly as described in claim 1, wherein the socket includes an elongated housing and a pair of mounting ears at two opposite ends for engagement with a pair of corresponding recesses in the socket supports, and each mounting ear has a horizontal slot for retainable engagement with a protrusion in the recess.

5. The I/O card assembly as described in claim 1, wherein the I/O connector includes an elongated housing and a pair of mounting ears at two opposite ends for engagement with a pair of corresponding recesses in the blocks, respectively, and a pair of horizontal grooves positioned in the housing at the two ends for retainable engagement with a pair of corresponding protrusions in the recesses, respectively.

6. The I/O card assembly as described in claim 1, wherein the top cove and the bottom cover is identical.

7. The I/O card assembly as described in claim 1, wherein a grounding clip is attached to the side wall of the main frame, a tang extends therefrom to contact a bottom surface of the PC board, and another tang integrally extends from the top cover to contact a top surface of the PC board.

8. The I/O card assembly as described in claim 1, wherein the socket supports and the blocks are integral with the main frame.

9. An I/O card assembly comprises:
    a main frame having two side walls;
    an auxiliary frame integrally formed in the main frame;
    a pair of blocks integrally positioned at front ends of the side walls, respectively;
    a pair of socket supports integrally positioned at rear ends of the side walls, respectively;
    a PC board seated on said auxiliary frame;
    a top cover and a bottom cover respectively attached onto the main frame to enclose the PC board therein;
    a socket positioned between said pair of socket supports, said socket having contact tails conductively mounted at a rear end of the PC board; and
    an I/O connector positioned between said pair of blocks, said I/O connector having contact tails conductively mounted at a front end of the PC board; wherein
    a first pair of protrusions respectively positioned on the blocks face to each other for engagement with a pair of corresponding grooves positioned at two opposite ends of the I/O connector, so that the I/O connector can initiatively be securely retained with regard to the main frame.

10. The I/O card assembly as described in claim 9, wherein the I/O connector has a first pair of mounting ears for engagement with a first pair of recesses in the blocks for restraining horizontal movement of the I/O connector with regard to the main frame, and the grooves of the I/O connector horizontally extending in a front-to-end direction incorporate the protrusions of the blocks for preventing vertical movement of the I/O connector with regard to the main frame.

11. The I/O card assembly as described in claim 9, wherein a second pair of protrusions respectively positioned on the socket supports face to each other for engagement with a pair of corresponding slots positioned at two opposite ends of the socket, so that the socket can initiatively be securely retained with regard to the main frame.

12. The I/O card assembly as described in claim 11, wherein the socket has a second pair of mounting ears for engagement with a second pair of recesses in the socket supports for restraining horizontal movement of the socket with regard to the main frame, and the slots of the socket horizontally extending in a front-to-end direction incorporate the protrusions of the socket supports for preventing vertical movement of the socket with regard to the main frame.

13. An I/O card assembly comprising:
a main frame having two side walls, an elongated space extending horizontally along each side wall in a front-to-end direction;
an auxiliary frame integrally formed in the main frame;
a pair of blocks integrally positioned at front ends of the side walls, respectively;
a pair of socket supports integrally positioned at rear ends of the side walls, respectively;
a PC board seated on said auxiliary frame;
a socket positioned between said pair of socket supports, said socket having contact tails conductively mounted at a rear end of the PC board;
an I/O connector positioned between said pair of blocks, said I/O connector having contacts tails conductively mounted at a front end of the PC board; and
a top cover and a bottom cover being attached to the main frame from the top and from the bottom, respectively, each cover having a main plate and a pair of shielding walls vertically extending along opposite side edges of the main plane in the front-to-end direction, wherein said shielding walls of the top cover extend downwardly and said shielding walls of the bottom cover extend upwardly, and each cover further comprises two pairs of shielding walls associated with hook sections positioned at both front and rear ends thereof for engagement within spaces in the blocks and in the socket supports, respectively.

* * * * *